US010541495B2

(12) United States Patent
Hwang

(10) Patent No.: US 10,541,495 B2
(45) Date of Patent: Jan. 21, 2020

(54) ELECTRICAL CONTACT OF ELECTRICAL CONNECTOR

(71) Applicants: FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventor: Tzu-Yao Hwang, New Taipei (TW)

(73) Assignees: FU DING PRECISION COMPONENT (SHEN ZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/355,857

(22) Filed: Mar. 18, 2019

(65) Prior Publication Data

US 2019/0288454 A1    Sep. 19, 2019

(30) Foreign Application Priority Data

Mar. 16, 2018 (CN) .......................... 2018 1 0216403
Mar. 16, 2018 (CN) ...................... 2018 2 0359099 U

(51) Int. Cl.
| | |
|---|---|
| *H01R 13/62* | (2006.01) |
| *H01R 13/646* | (2011.01) |
| *H01R 12/71* | (2011.01) |
| *H01R 13/24* | (2006.01) |
| *H01R 12/70* | (2011.01) |

(52) U.S. Cl.
CPC ......... *H01R 13/646* (2013.01); *H01R 12/716* (2013.01); *H01R 13/2442* (2013.01); *H01R 12/707* (2013.01)

(58) Field of Classification Search
CPC .. H05K 7/1053; H05K 7/1023; H05K 7/1038; H01R 13/193
USPC .................. 439/331, 73, 330, 342, 525, 526
See application file for complete search history.

(56) References Cited

U.S. PATENT DOCUMENTS

| | | | |
|---|---|---|---|
| 9,089,526 B2 * | 7/2015 | Tchernitchin | A61K 36/185 |
| 9,118,141 B2 * | 8/2015 | Yeh | H01R 13/533 |
| 9,192,070 B2 * | 11/2015 | Tan | H05K 7/10 |
| 9,214,754 B2 * | 12/2015 | Yeh | H01R 13/516 |
| 9,787,013 B2 * | 10/2017 | Sasaki | H01R 13/6581 |
| 2005/0287858 A1 * | 12/2005 | Toda | H05K 7/1053 |
| | | | 439/331 |

* cited by examiner

*Primary Examiner* — Phuong Chi Thi Nguyen
(74) *Attorney, Agent, or Firm* — Wei Te Chung; Ming Chieh Chang

(57) ABSTRACT

A plurality of contact are received within the corresponding passageways of the insulative housing of an electrical connector, respectively. Each contact has juxtaposed first body and second body angled with each other via a connecting section linked therebetween. A resilient contacting section extends upwardly from the first body. The bottom portion of the second body forms sideward spaced first blade and second blade with a slit therebetween, wherein a soldering tail further extends from the first blade, and the second blade is sideward farther from the first body than the first blade is. The bottom edge of the first body is lower than the bottom edge of the connecting sections o as to form another slit between the first body and the second body under the connection section.

11 Claims, 8 Drawing Sheets

ELECTRICAL CONTACT OF ELECTRICAL CONNECTOR

BACKGROUND OF THE INVENTION

1. Field of the Invention

The present invention relates generally to an electrical contact, and more particularly to the electrical contact with structures meeting impedance requirements. This application relates to another copending application having the same applicant, the same title and the same filing date with the instant application.

2. Description of Related Arts

U.S. Pat. No. 8,454,373 discloses en electrical contact of an electrical connector for use with a CPU (Central Processing Unit). The contact includes two juxtaposed and mutually angled parts, of which one has the resilient upwardly extending contacting section and the other has the stiff downwardly extending tail section. The feature of such patent is to provide the barbed structure on two lateral outer sides of the these two parts, respectively, for enhancing the retention force thereof compared with the earlier prior art having the barbed structure only on the part having the tail section. Anyhow, some unwelcomed deviation away from the regulated 85+/−15Ω of the contact occurs due to the positions and the dimensions of the contacting section and the tail section disadvantageously.

An improvement upon the contacting section and/or the tail section is desired.

SUMMARY OF THE INVENTION

An object of the invention is to provide an electrical connector with an insulative housing having opposite top and bottom faces thereof, and therein a plurality of passageways each extending through both the opposite top and bottom faces in the vertical direction. A plurality of contact are received within the corresponding passageways, respectively. Each contact has juxtaposed first body and second body angled with each other via a connecting section linked therebetween. A resilient contacting section extends upwardly from the first body. The bottom portion of the second body forms sideward spaced first blade and second blade with a slit therebetween, wherein a soldering tail further extends form the first blade, and the second blade is sideward farther from the first body than the first blade is. The bottom edge of the first body is lower than the bottom edge of the connecting section so as to form another slit between the first body and the second body under the connection section. Through the structure arrangement around the soldering tail, the unwelcomed deviation of the regulated impedance can be removed.

Another object of the invention is to widen the contacting section with a slit formed therein so as to remove the unwelcomed deviation of the regulated impedance occurring around the contacting section.

DETAILED DESCRIPTION OF THE PREFERRED EMBODIMENT

Figure 1:
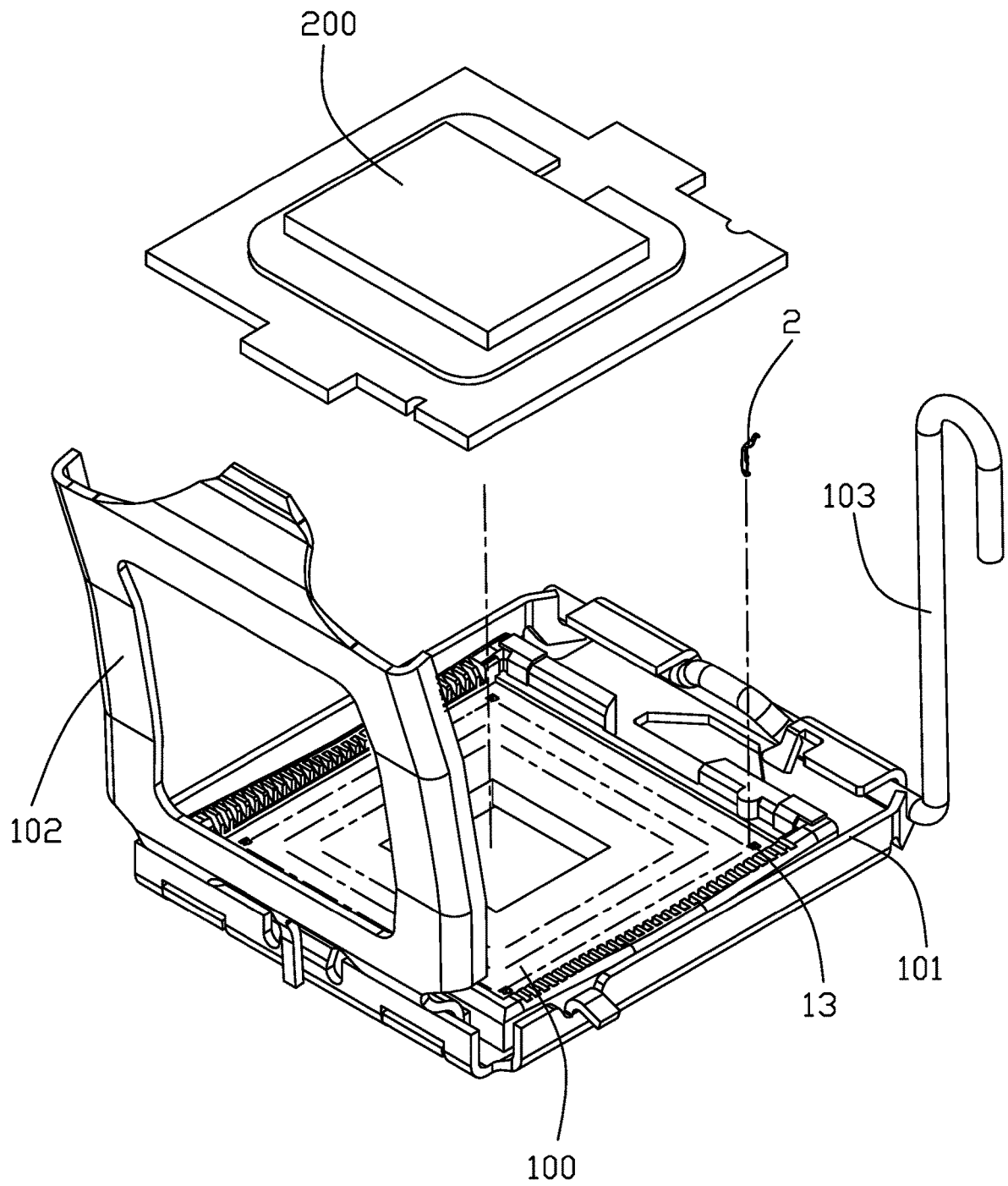
FIG. 1 is a perspective view of an electrical connector and the electronic package adapted to be received therein, according to a first embodiment of the present invention.
Figure 2:
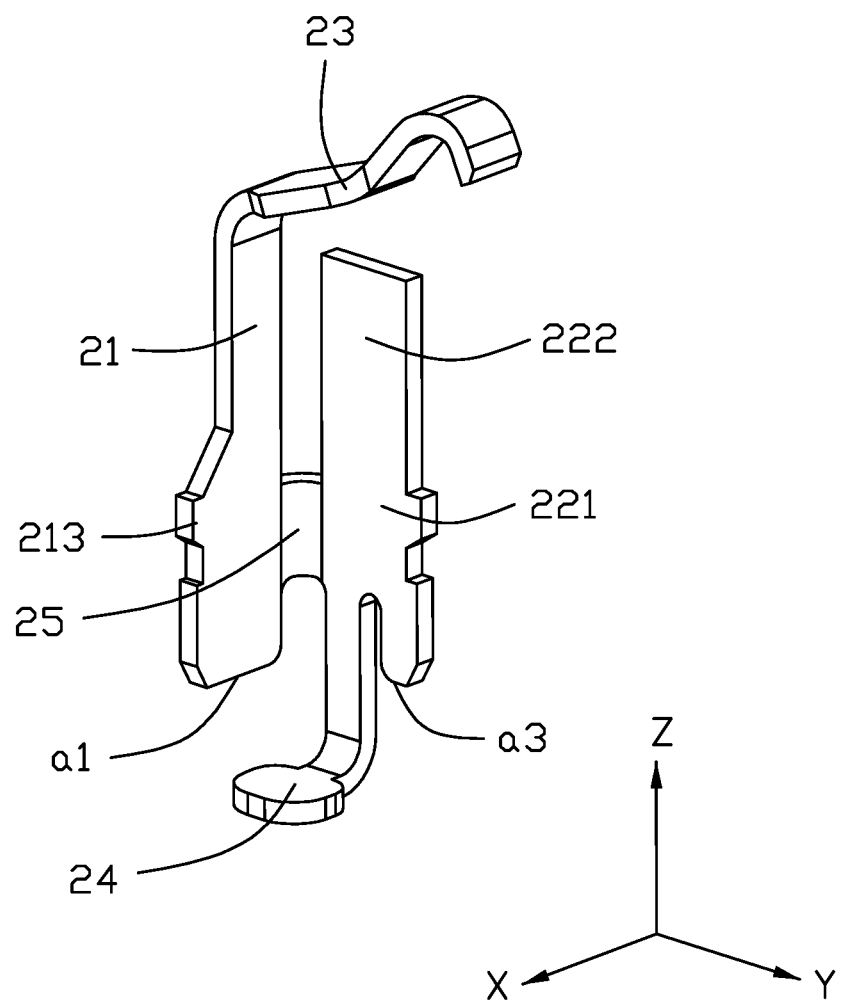
FIG. 2 is a perspective view of the electrical contact of the electrical connector of FIG. 1.
Figure 3:
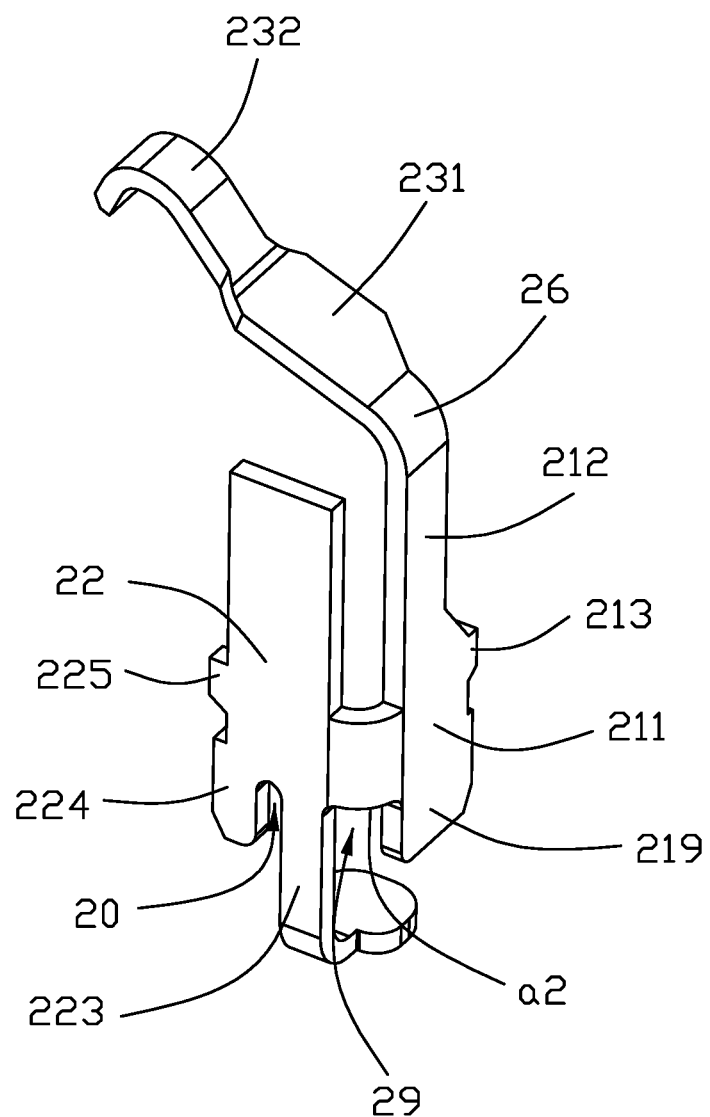
FIG. 3 is another perspective view of the electrical contact of the electrical connector of FIG. 1.
Figure 4:
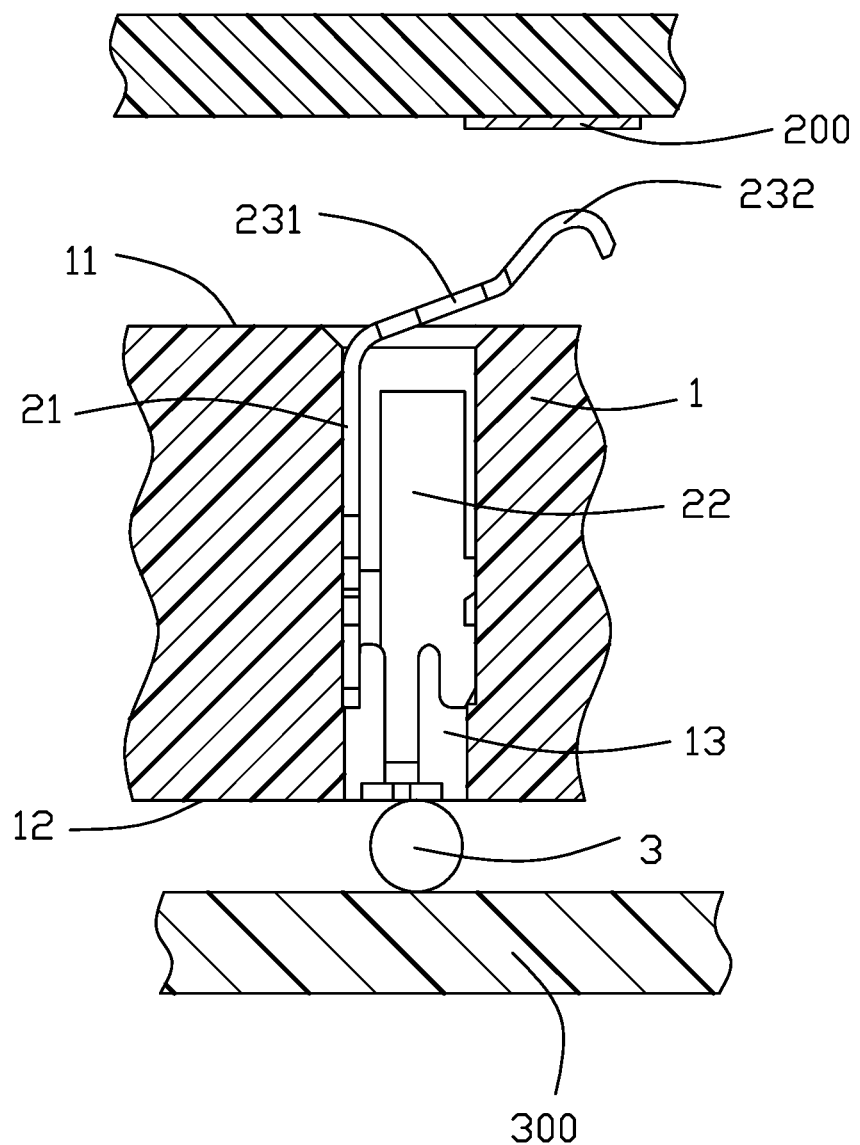
FIG. 4 is a cross-sectional view of the electrical connector and the associated electronic package of FIG. 1 and further a printed circuit board on which the electrical connector is mounted.
Figure 5:
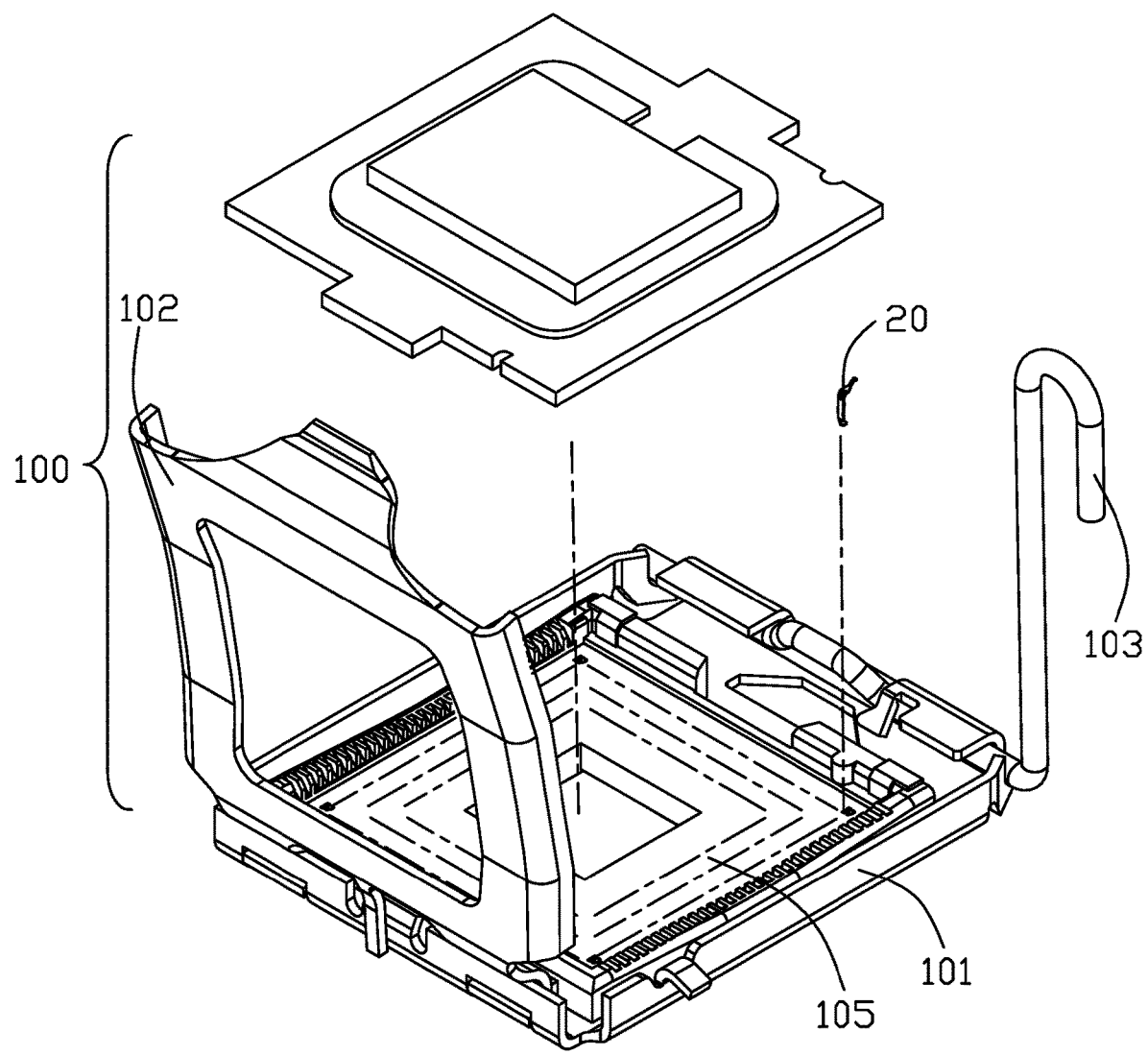
FIG. 5 is a perspective view of the electrical connector according to a second embodiment of the present invention.
Figure 6:
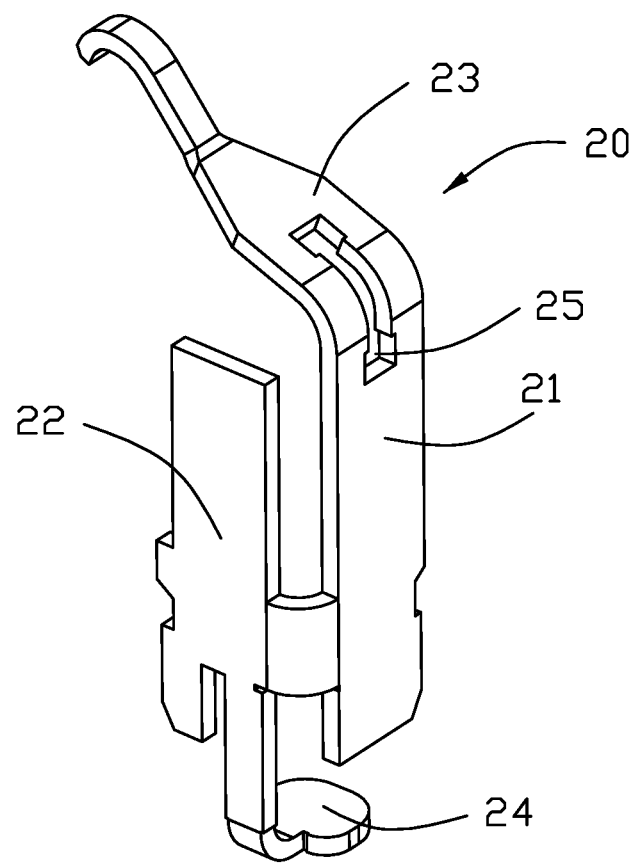
FIG. 6 a perspective view of the electrical contact of the electrical connector of FIG. 5.
Figure 7:
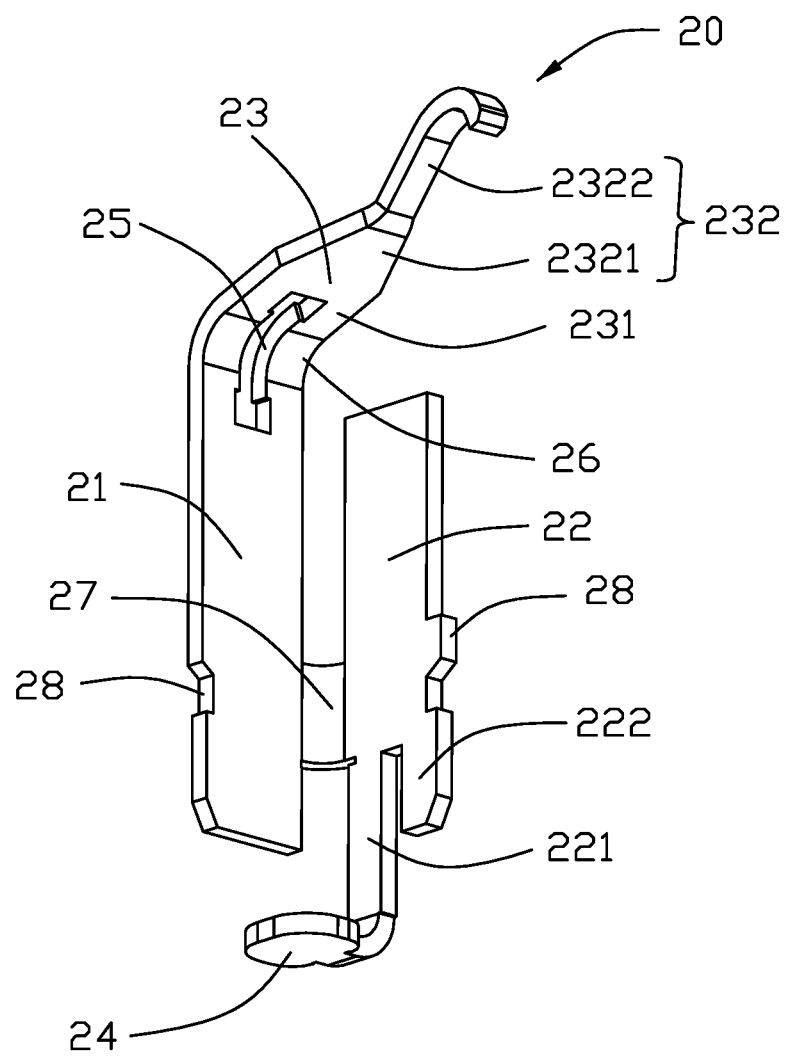
FIG. 7 is another perspective view of the electrical contact of the electrical connector of FIG. 5.
Figure 8:
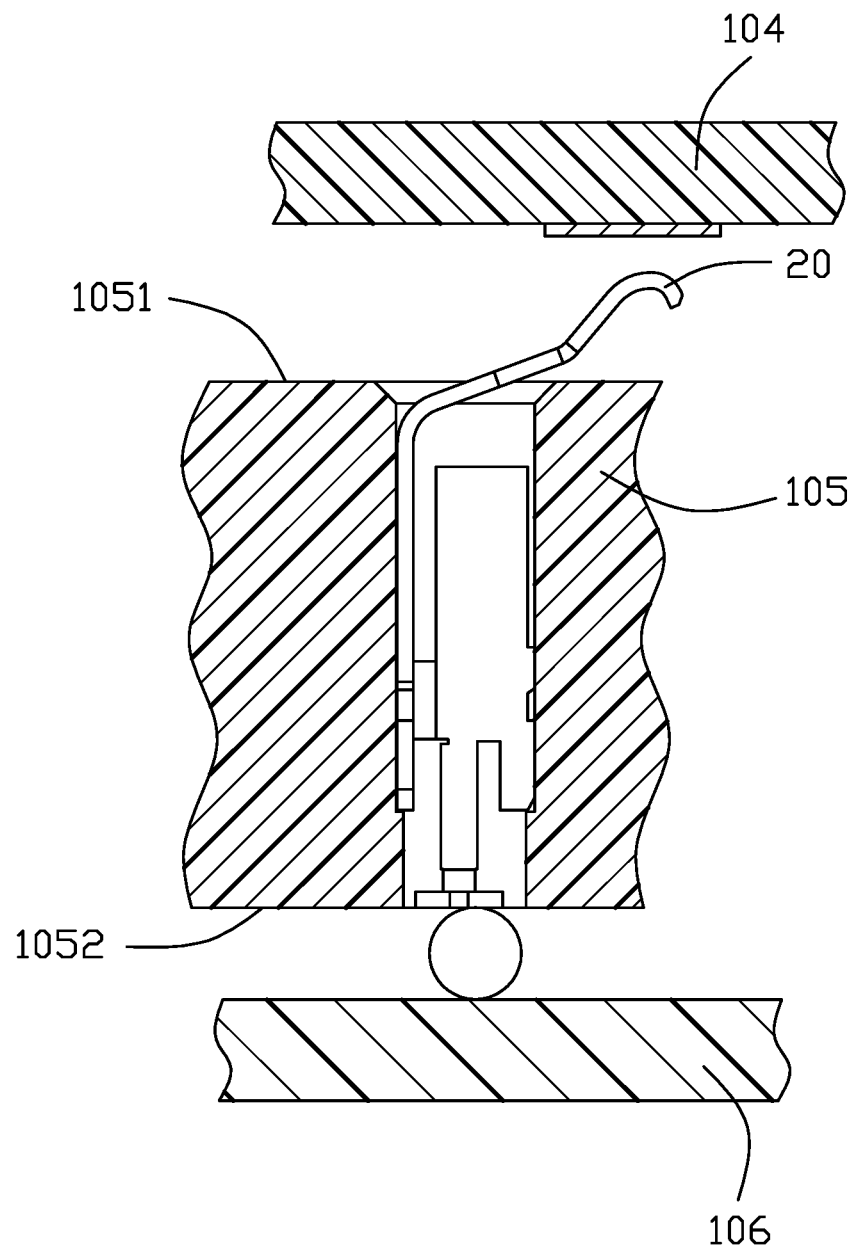
FIG. 8 is a cross-sectional view of the electrical connector and the associated electronic package of FIG. 5 and further a printed circuit board on which the electrical connector is mounted.

Referring to FIG. 1-14, an electrical connector 100 for electrically connecting the electronic package 200 to the printed circuit board 300, includes an insulative housing 1 with a plurality of passageways 13 to securely receive a plurality of corresponding contacts 2 therein. A plurality of solder balls 3 are attached to the corresponding contacts 2, respectively. The electrical connector 100 further includes a stiffener 101 surrounding the housing 1, a load plate 102 pivotally mounted to one end of the stiffener 1 for holding the electronic package 200 in the housing 1, and a lever 103 pivotally mounted to the other end of the stiffener 1 for securing the load plate 102 in position. In the embodiment, for describing the contact 2, it is defined with the vertical direction Z, the front-to-back direction Y and the transverse direction X which are perpendicular with one another.

The housing 1 forms two opposite top face 11 and bottom face 12. The passageways 13 extend through both the top face 11 and the bottom face 12 in the vertical direction. The contact 2 formed by sheet metal, includes a first body 21, a second body 22, a spring arm 23 extends upwardly from the first body 21, a horizontal soldering tail 24 extends from the second body 22. In this embodiment, a plane the first body 21 lies, extends along the transverse direction X, and another plane the second body 22 lies, extends along the front-to-back direction Y. Understandably, other angled relations between these two planes are feasible as long as those angles are obtuse angles while the right angle may be the best in this embodiment. A connecting section 25 is linked between the first body 21 and the second body 22, and is spaced from the soldering tail 24 in the vertical direction with a first distance.

The spring arm 23 is linked to the first body 21 via a bending section 26. The spring arm 23 includes a plate section 231 connected to the linking section 26, and a curved contacting section 232 upwardly extending from the plate section 231. Notably, the width of the plate section 231 is larger than those of both the contacting section 232 and the bending section 26. The widened plate section 231 may provide stability of the spring arm 23 during mating with the electronic package 200.

The first body 21 includes a vertical section 211 and a narrowed section 212 extending upwardly from the vertical section 211. A width of the bending section 26 is similar to that of the narrowed section 212. Notably, the vertical section 211 is required to be wide enough for electrically coupling with the second body 22 for impedance adjustment while the narrowed section 212, which is linked to the spring arm 23 via the bending section 26, should be narrow enough for sufficient resiliency consideration.

The second body 22 includes an upper extending section 222 and a lower retaining section 221. The lower portion of the retaining section 221 forms a first blade 223 and a second blade 224 sideward spaced from each other with therebetween a slit 20 of a width dimension around 0.1 mm~0.25 mm. The soldering section 24 extends horizontally from the bottom end of the first blade 223. The dimension of the second blade 224 along the vertical direction Z is around 0.25 mm~0.40 mm. The first body 21, the connecting section 25 and the second blade 224 forms a bottom edge/end a1, a2 and a3, respectively, wherein the bottom end a1 and the bottom end a3 are lower than the bottom end a2 so as to form another slit 29 located under the connecting section 25 and sideward between the first blade 223 and the first body 21. A first barbed structure 213 is formed on a lateral outer side of the first body 21, and a second barbed structure 225 is formed on a lateral outer side of the retaining section 221 of the second body 22. Understandably, retention slots (not shown) are formed in the housing 1 beside the corresponding passageway 13 for holding the corresponding first barbed structure 213 and the second barbed structure 225, respectively.

When the electronic package 200 is mounted upon the connector 100, the load plate 102 presses downwardly the electronic package 200 to have the electronic package 200 electrically connected with the contacts 2. Different from the prior art design, in this embodiment, an extension portion 219 of the first body 21 and the second blade 224 of the second body 22 are both located below the connecting section 25 in the vertical direction and beside the first blade 223 where the soldering tail 24 is linked, thus adjusting/lowering the impedance thereabouts. In this embodiment, the whole impedance is maximum when the width of the slit 20 between the first blade 223 and the second blade 224 is around 0.30 mm. In addition, when the electronic package 200 is connected to the contact 2, the widened plate section 231 is roughly parallel to the top face 11 of the housing 1 so as to enhance coupling between the contact 2 and the conductive pad of the electronic package 200. In brief, the arrangement of this embodiment may decrease the distance between the neighboring contacts, thus lowering the impedance thereof.

Referring to FIGS. 5-8, the electrical connector 100 connects the electronic package 104 to the printed circuit board 106. The connector 100 includes an insulative housing 105 with a plurality of passageways (not labeled) to receive the corresponding contacts 20, respectively. The connector 100 further includes a metallic stiffener 101 surrounding the housing 105, and the load plate 102 and the lever 103 respectively pivotally mounted to two opposite ends of the stiffener 101.

The housing 105 forms opposite top face 1051 and bottom face 1052. The passageways extend through both the top face 1051 and the bottom face 1052. The contact 20 includes the first body 21 and the second body 22. A spring arm 23 extends upwardly from the first body 21, and a soldering tail 24 downwardly extends from the second body 22. The spring arm 23 forms an elongated slot 25 along an extension direction thereof around the curved adjoining or bending section 26, and the slot 25 essentially extends from the first body 21 to the spring arm 23 and through the contact 20 in the thickness direction.

The spring arm 23 includes an wide plate section 231 and a narrow contacting section 232. The contacting section 232 includes a tapered transitional region 2321 linked to the plate section 231, and a bulged head 2322 for contacting the conductive pad of the electronic package 104.

A width of the slot 25 is not more than one third of the width of the adjoining/bending section 26. In this embodiment, two opposite ends of the slot 25, which are respectively in the first body 21 and the plate section 231 wider than the remaining portion thereof. Alternately, other shapes like rectangle or oval may be acceptable. In other words, because of existence of the slot 25 in the contact 20 which may lower rigidity of the spring arm 23 for upwardly pressing the corresponding conductive pad of the electronic package 104, the width of the first body 21 or the plate section 231 of the spring arm 23 may be properly enlarged to decrease the distance between the neighboring contacts 20 so as to lower the impedance thereof.

The first body 21 and the second body 22 are of a plate configuration with a connecting section 27 linked therebetween. In this embodiment, the first body 21 and the second body 22 are perpendicular to each other. The barbs 28 are formed on the lateral outer edge of the second body 22. Similar to the first embodiment, the second body forms a first blade 221 and the second blade 222 wherein the soldering section 24 extends from the first blade 221, and a slit (not labeled) is formed between the first blade 221 and the second blade 222 for adjusting impedance.

In brief, both embodiments is to reduce the distance between the neighboring contacts by increasing the width of the corresponding portion of the contact for lowering the corresponding impedance thereof, if the pitch between the neighboring contacts keeps the same as before, wherein the second body forms the spaced first blade and second blade and/or the spring arm forms a slot around the adjoining section with the first body.

What is claimed is:

1. An electrical connector for electrically connecting an electronic package to a printed circuit board, comprising:
    an insulative housing forming a plurality of passageways to securely receive a plurality of corresponding contacts, a plurality of solder balls being attached to the corresponding contacts, respectively;
    a stiffener surrounding the housing a load plate pivotally mounted to one end of the stiffener for holding the electronic package in the housing, and a lever pivotally mounted to the other end of the stiffener for securing the load plate in position;
    each of said contacts formed by sheet metal and including:
    a first body and a second body sideward spaced from and angled with each other and linked to each other via a connecting section;
    a spring arm extending upwardly from an upper portion of the first body;
    a first blade and a second blade extending downwardly from a lower portion of the second body and sideward spaced from each other with a slit therebetween; and
    a horizontal soldering tail linked at a bottom end of the first blade; wherein
    the second body forms a barbed structure on a lateral outer edge for retaining the contact in the corresponding passageway, and said barbed structure is higher than the first blade and the second blade in the vertical direction; wherein
    the connecting section is higher than the first blade and the second blade in the vertical direction; wherein
    a width of the slit is around 0.10 mm~0.25 mm and a length of the slit is around 0.25 mm~0.40 mm.

2. The electrical connector as claimed in claim 1, wherein the first body further includes a downward extension located below the connecting section so as to form another slit sideward between the downward extension and the first blade and under the connecting section.

3. The electrical connector as claimed in claim 1, wherein the first body further forms another barbed structure on a lateral outer edge opposite to the barbed structure on the second body, and said another barbed structure is higher than the downward extension in the vertical direction.

4. The electrical connector as claimed in claim 1, wherein said first body is perpendicular to the second, in a top view taken along the vertical direction.

5. The electrical connector as claimed in claim 1, wherein the second body further includes an upper extending section located higher than the connecting section in the vertical direction.

6. The electrical connector as claimed in claim 1, wherein a width of the slit is 0.12 mm and a length of the second blade is 0.3 mm.

7. The electrical connector as claimed in claim 1, wherein said spring arm obliquely extends from an upper end of the first body via a bending section therebetween, and includes a plate section linked to the bending section and a bulged contacting section.

8. The electrical connector as claimed in claim 6, wherein a slot extends along the bending section with two opposite ends respectively terminated at the plate section and the first body and through the contact in a thickness direction.

9. The electrical connector as claimed in claim 8, wherein a width of the slot at either end is larger than those of remainders of the slot.

10. An electrical connector for electrically connecting an electronic package to a printed circuit board, comprising:
    an insulative housing forming a plurality of passageways to securely receive a plurality of corresponding contacts, a plurality of solder balls being attached to the corresponding contacts, respectively;
    a stiffener surrounding the housing a load plate pivotally mounted to one end of the stiffener for holding the electronic package in the housing, and a lever pivotally mounted to the other end of the stiffener for securing the load plate in position;
    each of said contacts formed by sheet metal and including:
    a first body and a second body sideward spaced from and angled with each other and linked to each other via a connecting section;
    a spring arm extending upwardly from an upper portion of the first body;
    a first blade and a second blade extending downwardly from a lower portion of the second body and sideward spaced from each other with a slit therebetween; and
    a horizontal soldering tail linked at a bottom end of the first blade;
    wherein
    said spring arm obliquely extends from an upper end of the first body via a bending section therebetween, and includes a plate section linked to the bending section and a bulged contacting section at a top end; wherein
    a slot extends along the bending section with two opposite ends respectively terminated at the plate section and the first body and through the contact in a thickness direction; wherein
    the second body forms a barbed structure on a lateral outer edge for retaining the contact in the corresponding passageway, and said barbed structure is higher than the first blade and the second blade in the vertical direction; wherein
    the connecting section is higher than the first blade and the second blade in the vertical direction; wherein
    a width of the slit is around 0.10 mm~0.25 mm and a length of the slit is around 0.25 mm~0.40 mm.

11. The electrical connector as claimed in claim 10, wherein a width of the slot at either end is larger than those of remainders of the slot.

* * * * *